United States Patent [19]

Weyrich

[11] 4,406,913
[45] Sep. 27, 1983

[54] SOLAR CELL WITH INCREASED EFFICIENCY

[75] Inventor: Claus Weyrich, Gauting, Fed. Rep. of Germany

[73] Assignee: Siemens Aktiengesellschaft, Berlin & Munich, Fed. Rep. of Germany

[21] Appl. No.: 327,482

[22] Filed: Dec. 4, 1981

[30] Foreign Application Priority Data

Dec. 16, 1981 [DE] Fed. Rep. of Germany ....... 3047383

[51] Int. Cl.$^3$ ........................................... H01L 31/06
[52] U.S. Cl. ................................... 136/259; 136/255; 136/258; 357/30
[58] Field of Search ................. 136/255, 256, 258 PC, 136/249 MS, 259; 357/30

[56] References Cited

U.S. PATENT DOCUMENTS

| Re. 30,383 | 8/1980 | Kaplow et al. | 136/249 MS |
|---|---|---|---|
| Re. 30,384 | 8/1980 | Kaplow et al. | 136/246 |
| 3,310,439 | 3/1967 | Seney | 136/259 |
| 3,969,746 | 7/1976 | Kendall et al. | 136/255 |
| 4,038,104 | 7/1977 | Tsutomu | 136/244 |
| 4,101,351 | 7/1978 | Shah et al. | 148/188 |
| 4,110,122 | 8/1978 | Kaplow et al. | 136/249 MS |
| 4,116,718 | 9/1978 | Yerkes et al. | 136/246 |
| 4,128,732 | 12/1978 | Kaplow et al. | 136/246 |
| 4,131,984 | 1/1979 | Kaplow et al. | 29/572 |

FOREIGN PATENT DOCUMENTS

| 2723620 | 12/1977 | Fed. Rep. of Germany | 136/249 MS |
|---|---|---|---|
| 2835246 | 3/1979 | Fed. Rep. of Germany | 136/249 MS |

OTHER PUBLICATIONS

Excerpt from "Solar Cells", Hovel, vol. 11 of *Semiconductors and Semimetals*, Academic Press, 1975, pp. 139–140.
"New Developments in Vertical Junction Silicon Solar Cells", J. Wohlgemuth et al., *Conference Record, 14th IEEE Photovoltaic Specialists Conf.* (1980), pp. 151–155.
"Analysis of Vertical Multijunction Solar Cells Using a Distributed Circuit Model", P. Shah, *Solid-State Electronics*, 1975, vol. 18, pp. 1099–1106, Pergamon Press.

Primary Examiner—Aaron Weisstuch
Attorney, Agent, or Firm—Hill, Van Santen, Steadman & Simpson

[57] ABSTRACT

A solar cell has a semiconductor body with a radiation-receiving surface having a ribbed structure and having a small pn-junction in the semiconductor body which is matched to follow the contour of the surface of the ribbed structure, and the interstices between adjacent ribs are filled with a material which is highly permeable to the solar radiation and which contains particles for scattering the solar radiation to a high degree situated therein.

8 Claims, 2 Drawing Figures

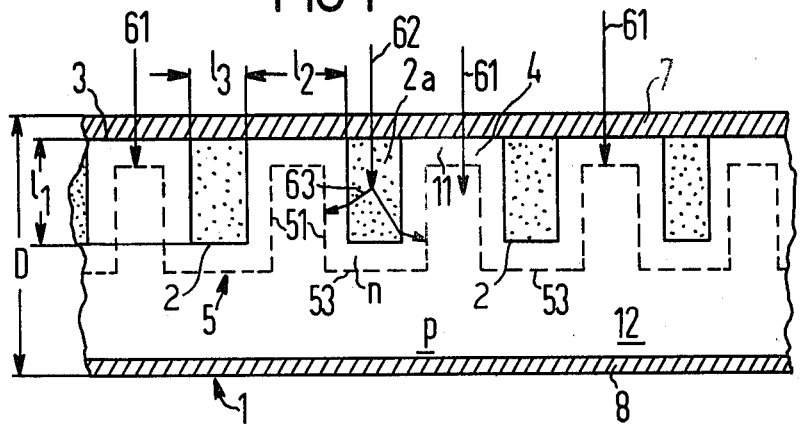
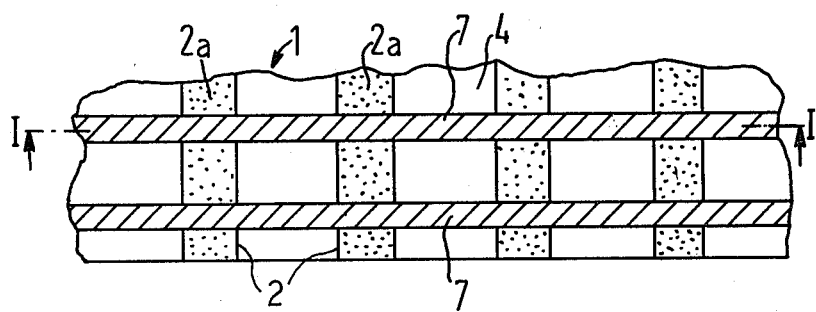

SOLAR CELL WITH INCREASED EFFICIENCY

BACKGROUND OF THE INVENTION

1. Field of the Invention

The present invention relates to solar cells, and in particular to solar cells having a ribbed structure on a radiation-receiving surface thereof.

2. Description of the Prior Art

A solar cell having a ribbed and/or honeycomb structure on a radiation-receiving surface thereof and a pn-junction below the ribbed surface which follows the contour of that surface, in contrast to solar cells with a plane surface and a pn-junction disposed in a plane parallel to the surface and perpendicular to the incident solar radiation, has been proposed in Hovel, "Solar Cells", pages 139 ff., Vol. 11 of *Semiconductors and Semimetals*, Academic Press, 1975. The ribs or honeycombs extend parallel to the incident solar radiation into the semiconductor body.

In an attempt to make such a solar cell insensitive to the destructive influence of cosmic radiation and the like, and in order to employ such a solar cell over the long periods of time necessary for, for example, space experiments, a semiconductor structure has been disclosed in *Conference Record, 14th IEEE Photovoltaic Specialists Conf.* (1980), pp. 151–155, which has the appearance in cross section of a comb with broad teeth and interstices between the teeth which are very narrow in comparison with the width of the teeth. The interstices are manufactured by etching a single crystal semiconductor wafer in an anisotropic manner, resulting in deep grooves at uniform intervals from one another in the surface of the semiconductor wafer, the deep grooves being very narrow in comparison to the distances between neighboring grooves. The surface of the grooves as well as the surface of the semiconductor material between adjacent grooves can be either a p or n layer, and the material disposed immediately below the surface is material of an opposite conductivity type, that is, n or p conductive material, resulting in a pn-junction close to the surface of the semiconductor body. The semiconductor body and the pn-junction generated in this manner have a surface comparable to that of a ribbed profile plate. FIG. 1 of the aforementioned publication shows such a single crystal semiconductor body manufactured by means of anisotropic etching.

SUMMARY OF THE INVENTION

It is an object of the present invention to provide a solar cell which has a high sensitivity and a correspondingly high degree of conversion efficiency of incident solar radiation into electrical energy which can be economically manufactured and which exhibits a high degree of mechanical stability.

It is a further object of the present invention to provide such a solar cell which permits attachment of electrical contacts on the radiation-receiving surface in a simple manner without the danger of breaking or interrupting such contacts.

The above objects are inventively achieved in a solar cell having a radiation-receiving surface with a ribbed structure, and a pn-junction immediately below the surface which follows the contour of the ribbed structure, in which the interstices between the ribs are filled with a material which is highly permeable to the incident solar radiation and which contains particles for scattering the radiation to a high degree.

The ribbed structure of the radiation-receiving surface of the solar cell, in contrast to solar cells having a plane radiation-receiving surface and a pn-junction disposed in a plane immediately therebelow, has a far greater effective volume for converting solar radiation into electrical energy, that is, such a ribbed solar cell has a greater volume in which absorbed solar radiation is converted into available electrical energy. Only a relatively thin layer along the surface of the pn-junction is effective for generating electrical energy, because pairs of charge carriers generated outside of this layer close to the pn-junction do not ultimately contribute to the generated electrical energy because minority carriers generated in the semiconductor material cannot arrive in the layer immediately surrounding the pn-junction by means of diffusion. The conventional solar cells described in the introduction which have a ribbed radiation-receiving surface do not make the most effective use of the increased conversion volume which is available as a result of the ribbed structure, because the incident radiation proceeds essentially perpendicular to the ribs so that the sides of the ribs receive a significantly less amount of incident radiation than do the bottoms of the grooves between the ribs. By filling the spaces or interstices between the ribs with a material which is highly permeable to the solar radiation and which contains particles for scattering the radiation, the radiation is scattered during its passage through the filler material so that the surfaces which form the sides of the grooves receive substantially the same amount of radiation as the bottom of the grooves.

DESCRIPTION OF THE DRAWINGS

FIG. 1 is a sectional view of a solar cell having a ribbed radiation-receiving surface with spaces between the ribs filled with radiation-scattering material constructed in accordance with the principles of the present invention.

FIG. 2 is a plan view of the structure shown in FIG. 1.

DESCRIPTION OF THE PREFERRED EMBODIMENTS

A portion of a solar cell constructed in accordance with the principles of the present invention is shown in cross section in FIG. 1. The solar cell consists of a semiconductor body 1 which may be, for example, comprised of polycrystalline material. The semiconductor body 1 has a plurality of periodically spaced grooves 2 which extend from the upper radiation-receiving surface 3 of the semiconductor body 1 toward the interior of the solar cell. The grooves may, for example, be generated by means of a saw device and have a depth referenced at $l_1$. The value $l_1$ may, for example, be in the range of 50% to 75% of the overall thickness D of the semiconductor body 1. The distance between adjacent grooves is referenced at $l_2$, which corresponds to the width of the ribs 4 which are formed by the grooves resulting in a comb-like structure. The width of the space between the walls of adjacent ribs 4 is referenced at $l_3$. As stated above, the groove and rib structure is preferably executed and dimensioned equidistantly and periodically. The contour of the pn-junction in the semiconductor body 1 is indicated at 5, the material 12 beneath the pn-junction being of a first conductivity type, and the material 11 above the pn-junction being of an opposite conductivity type. As shown in the exemplary embodiment of FIG. 1, the material 11 is n-type material and the material 12 is p-type material, however, the conductivity types may be reversed without departing from the inventive concept disclosed herein.

The solar cell has a plurality of strip electrodes 7 disposed on the upper surface thereof. The electrodes 7, as can be seen in FIG. 2, are spaced from one another and traverse the ribs 4 as well as the grooves 2. The strip electrodes 7 form an electrical contact for the semiconductor material 11 above the pn-junction 5 which is effective for the entire upper surface 3 of the semiconductor body 1. Similar electrodes 8 are mounted on the bottom of the semiconductor body 1, however, because no solar radiation need permeate the bottom surface of the solar cell, the electrode 8 may be a surface-wide electrode. The strip electrodes 7 are combined at the edge of the solar cell (not shown) to form a common terminal. A surface-wide electrode which is permeable to the incident solar radiation may be employed in place of the strip electrodes 7, however, strip electrodes such as the electrodes 7 are more economical and the disadvantage associated therewith of blocking a slight surface area of the surface 3 of the semiconductor body 1 from incident solar radiation is negligible.

Solar radiation which is incident upon the surface portions of the ribs 4 of the semiconductor body 1 is indicated with arrows 61 in FIG. 1. Solar radiation incident in the grooves 2 between the ribs 4 is referenced with 62. In accordance with the principles of the present invention, the volume between the ribs 4 is filled with a material 2a which significantly scatters the incident solar radiation and which absorbs as little solar radiation as possible. The material may be a synthetic such as, for example, epoxy resin which is filled with particles for scattering the solar radiation such as, for example, small metal oxide particles such as $TiO_2$ particles. A suitable material for filling the grooves 2 is of the type of material which is employed in the different context of LED displays for performing a different function. The particles carried in the material 2a are randomly distributed in the material.

Radiation 63 which arises from the solar radiation 62 as a result of scattering by the particles in the material 2a is shown in FIG. 1. The radiation 63 is simply the primary solar radiation which is deflected and which thus arrives at that portion of the pn-junction which is generally parallel to the direction of incident radiation, referenced at 51 in FIG. 1.

The portions of the pn-junction 5 which proceed horizontally inside of the semiconductor body 1 are referenced at 53. Residual primary radiation 62 penetrating into those portions of the pn-junction 5 which are parallel to the portions 53 similarly generate pairs of charge carriers which contribute to the overall conversion of solar energy into electrical energy.

A significant advantage of the structure shown in FIG. 1 is that the originally planar surface 3 of the semiconductor body 1 has been reconstituted, whereby those portions of the semiconductor body 1 which were initially eliminated by means of the cutting of the grooves 2 are now reconstituted by filling the grooves with synthetic material 2a such that a substantially planar surface is again present. This is preferable for the application of the electrode strips 7, which can proceed across the surface 3 of the semiconductor body 1 without the danger of breaks or interruptions which may occur where the electrodes 7 cross the unfilled grooves of conventional solar cells.

As stated above, the grooves 2 may be generated by means of sawing. The ribbed structure may also be generated by a sufficiently high-energy laser beam which is directed at the semiconductor surface 3 in an appropriate pattern. The grooves can also be generated by etching insofar as this method does not result in difficulties which are too great to be overcome in the preferred case of a polycrystalline semiconductor material. The major difficulty in the etching method is that of achieving a sufficiently deep groove which is at the same time very narrow.

The embodiment shown in FIGS. 1 and 2 is preferably dimensioned such that the depth $l_1$ is greater than $1/\alpha$, where $\alpha$ is the coefficient of absorption for the long-wave portion of the incident solar radiation 61 and 62. The width $l_2$ of the ribs 4 is preferably selected less than or equal to twice the sum of $l_N$ and $l_P$ ($l_2 \leq 2(l_N + l_P)$), wherein $l_N$ is the electron diffusion length of the semiconductor material comprising the semiconductor body 1, and $l_P$ is the hole diffusion length of the semiconductor material. Given such dimensioning, all charge carriers generated within the volume of the ribs 4 by the solar radiation 61 and 62 are collected. The width $l_3$ of the grooves 2 is selected as small as possible given the particular method by which the grooves are generated. If the grooves are generated by means of sawing, the value $l_3$ is limited by the width of the saw blade which may be approximately 50 micrometers. Smaller values for $l_3$ can be achieved by cutting the grooves by means of a laser. If an etching technique is employed to generate the grooves 2, the groove width $l_3$ is dependent upon the groove depth $l_1$ and on the crystal orientation which is exhibited by the semiconductor body 1. The doping of the semiconductor body 1 resulting in the pn-junction 5 can be undertaken by diffusion of the corresponding donors and acceptors, depending upon whether the semiconductor body 1 is p or n conductive semiconductor material.

The structure disclosed and claimed herein permits optimum exploitation of the incident solar radiation in the volume of the ribs 4. If it is assumed that the solar radiation 61 and 62 is substantially perpendicular to the semiconductor body surface 3, at least one surface section proportional to $l_2/(l_2+l_3)$ of the solar cell is available for converting the solar energy into electrical energy, which is augmented by the scatter of the radiation component 62 in the material 2a situated in the grooves 2 which is filled with scattering particles. A significantly enlarged volume of the pn-junction 5 is thus available for energy conversion. The solar cell can, however, be manufactured with only a slight increase in technological outlay which can be easily integrated into existing automated mass production methods.

Although modifications and changes may be suggested by those skilled in the art it is the intention of the inventor to embody within the patent warranted hereon all changes and modifications as reasonably and properly come within the scope of his contribution to the art.

I claim as my invention:

1. A solar cell comprising:

a semiconductor body having a solar radiation-receiving surface having a plurality of parallel grooves therein forming a plurality of ribs, said semiconductor body having a pn-junction which follows the contour of said ribs and grooves; and a filler material filling said grooves, said filler material being permeable to said solar radiation and having particles suspended therein for scattering said solar radiation for increasing the amount of said solar radiation which reaches the sides of said ribs.

2. The solar cell of claim 1 wherein said filler material is a synthetic material.

3. The solar cell of claim 1 wherein said filler material is an epoxy resin having particles of $TiO_2$ suspended therein.

4. The solar cell of claim 1 wherein said semiconductor body is comprised of a polycrystalline semiconductor material.

5. The solar cell of claim 1 wherein the depth of said grooves in said semiconductor body is greater than $1/\alpha$, wherein $\alpha$ is the coefficient of absorption of the material comprising said semiconductor body for a long-wave component of said solar radiation.

6. The solar cell of claim 1 wherein the width of said ribs is less than or equal to twice the value $(l_N+l_P)$, wherein $l_N$ is the diffusion length for the electrons in the material comprising said semiconductor body and wherein $l_P$ is the diffusion length for the holes in said material comprising said semiconductor body.

7. The solar cell of claim 1 wherein said grooves are generated by sawing said semiconductor body.

8. The solar cell of claim 1 wherein said grooves are generated by cutting said semiconductor body with a laser beam.

* * * * *